United States Patent [19]
Wang et al.

[11] Patent Number: 5,763,307
[45] Date of Patent: Jun. 9, 1998

[54] BLOCK SELECT TRANSISTOR AND METHOD OF FABRICATION

[75] Inventors: Hsingya Arthur Wang, Saratoga; Qimeng Zhou, Santa Clara, both of Calif.

[73] Assignee: Advanced Micro Devices, Inc., Sunnyvale, Calif.

[21] Appl. No.: 745,278

[22] Filed: Nov. 8, 1996

[51] Int. Cl.⁶ ............................................. H01L 21/8247
[52] U.S. Cl. .......................... 438/258; 438/594; 438/637
[58] Field of Search .............................. 438/257, 258, 438/263, 266, 593, 594, 637, 657, 672

[56] References Cited

U.S. PATENT DOCUMENTS

| | | | |
|---|---|---|---|
| 4,962,058 | 10/1990 | Cronin et al. | 438/637 |
| 5,010,028 | 4/1991 | Gill et al. | 438/594 |
| 5,597,750 | 1/1997 | Pio et al. | 438/258 |
| 5,607,873 | 3/1997 | Chen et al. | 438/637 |

*Primary Examiner*—Chandra Chaudhari
*Attorney, Agent, or Firm*—Fliesler, Dubb, Meyer & Lovejoy, LLP

[57] ABSTRACT

A flash memory device having a reduced area is disclosed. The device uses a polyI layer to act as a select transistor for the memory cells comprising the core array. Also, a ground plate is used to isolate the areas of the memory array where high voltage devices should not be located, thereby allowing peripheral components to be fabricated in the core array area. Also disclosed is a polyII layer used to access two sublines controlling two different sectors of the memory array architecture. By using such a layout, die space savings is attained.

17 Claims, 15 Drawing Sheets

BLOCK SELECT TRANSISTOR AND METHOD OF FABRICATION

FIELD OF THE INVENTION

The present invention relates to flash memory devices, and more particularly to a flash memory structure having a reduced physical area by having a modified core array layout containing both a block select transistor array and a core memory array.

BACKGROUND OF THE INVENTION

Non-volatile memory devices, for example, "Flash" memory devices are becoming increasingly popular in data storage applications. The term "Flash" electrically erasable and programmable read-only memory or "Flash EEPROMs" generally refer to EEPROM memory cells which are programmed by hot electron injection and erased by Fowler-Nordheim tunneling.

Generally, an array of flash EEPROM memory cells may be formed on a semiconductor substrate in a series of rows and columns, accessed by wordlines and bitlines. The wordlines are connected to the control gate of each flash EEPROM memory cell in a given row. The bitlines are coupled to the drain of each individual EEPROM memory cell along a given column.

In memory devices such as flash EEPROMs, the memory cells are arranged in a common region, with the memory cell region of the flash memory array being referred to as the "core" area of the chip. All other components necessary for the operation of the flash memory devices, such as block select transistors, charge pumps, etc. are located in the peripheral area of the chip.

The peripheral area of a flash memory contains devices of varying sizes and are generally formed on a section of the chip different from the core array. More specifically, in standard flash EEPROM devices the memory array is defined by a particular number of sectors. Each sector includes a core array portion and a peripheral portion. For example, if a flash EEPROM device contains six sectors, each of those sectors contains a core array having a given number of transistors and a separate peripheral array, fabricated outside the core array, which contains the block select transistors used to select which of the core array transistors is going to be operated upon. In conventional flash EEPROM devices, a non-volatile random access memory (RAM) chip is used as a select transistor.

Standard flash EEPROM structures take up a large amount of die space. With the industry trend of providing more and more memory capacity on a given integrated circuit chip, physical area becomes a premium. The standard fabrication and layout techniques are insufficient to handle the limited space requirements required by the present trend of reducing component sizes.

SUMMARY OF THE INVENTION

The present invention provides an improved block sector layout and a method of fabricating the same for flash EEPROM memory devices. In one aspect of the invention, a flash EEPROM memory device is disclosed having a core array formed on a semiconductor substrate, the core array containing a plurality of transistors operable to store data; a peripheral array formed on a semiconductor substrate, with the peripheral array being fabricated within the core array and further including a plurality of transistors operable to select from among the core array transistors; and a ground plate fabricated between the core array and the peripheral array, wherein the core array and the peripheral array are fabricated on the same portion of the integrated circuit chip. The layout of the flash EEPROM device places the peripheral components of the device into the core array thereby reducing the total area taken up by the memory array.

In another aspect of the present invention, a ground plate is used to isolate the areas where high voltage components should not be located. With the use of the ground plate, higher voltage peripheral components can be placed within the core array.

An advantage of the present invention is the ability to increase flash memory density by fabricating a flash memory device on a reduced die space.

Another advantage of the present invention is that it reduces fabrication costs. A feature of the present invention is that it can be performed with standard processing techniques.

BRIEF DESCRIPTION OF THE DRAWINGS

These and other advantages and features of the present invention will become apparent from the following description of the embodiments, taken in conjunction with the accompanying drawings, where like numerals represents like elements, in which.

DETAILED DESCRIPTION OF THE EMBODIMENTS

An improved flash EEPROM device structure and method of fabricating the same is disclosed herein which overcomes the limitations encountered in standard EEPROM devices.

Figure 1:
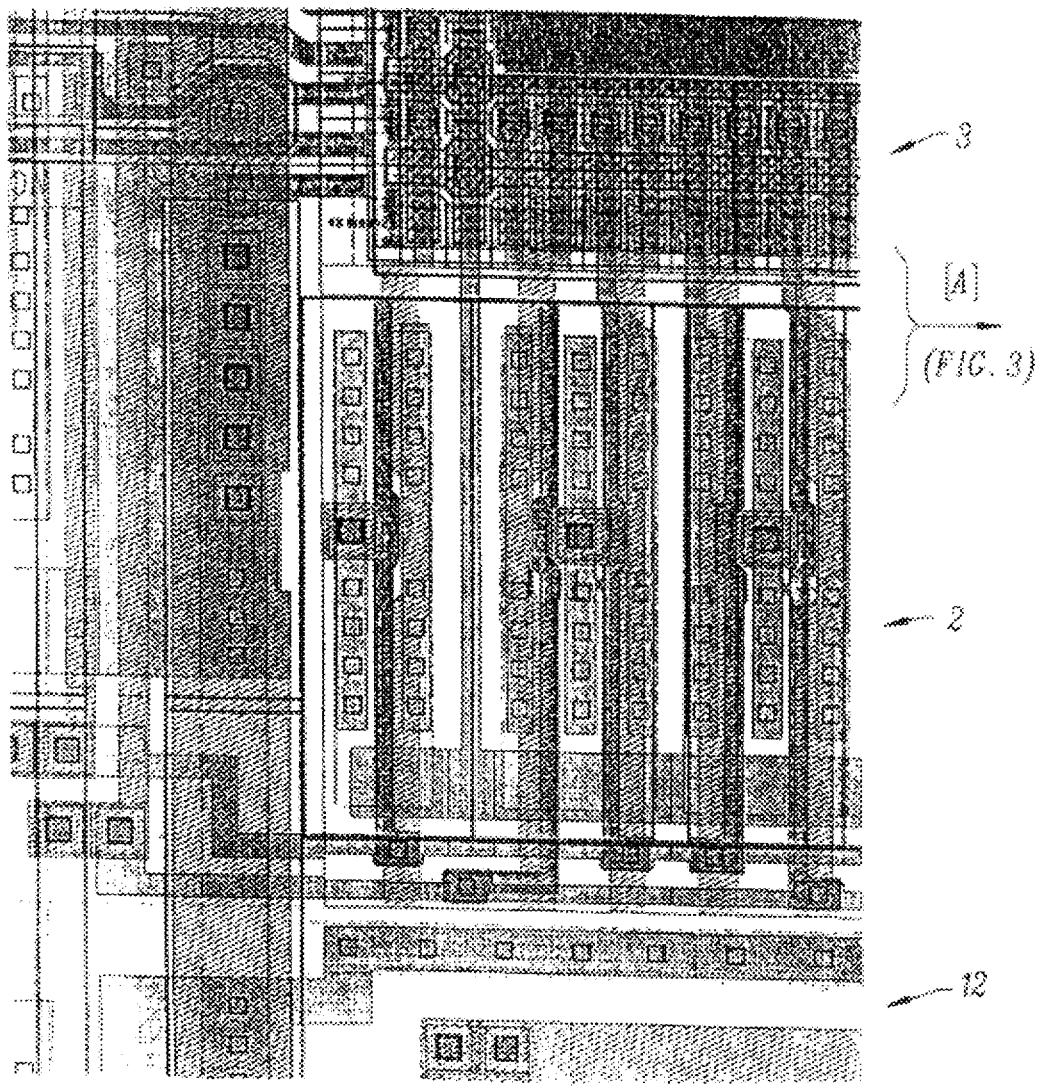
FIG. 1 depicts a top view of the block select sector of a standard flash EEPROM device.

FIG. 1 depicts a portion of a standard flash memory cell. As shown in FIG. 1, the area taken up by the peripheral devices 2 and the interface devices 3, for coupling the flash EEPROM device with external devices, takes up a large amount of the overall memory area. As discussed above, the varying sizes of the peripheral devices 2 is what requires the most space for a given device area.

Figure 2:
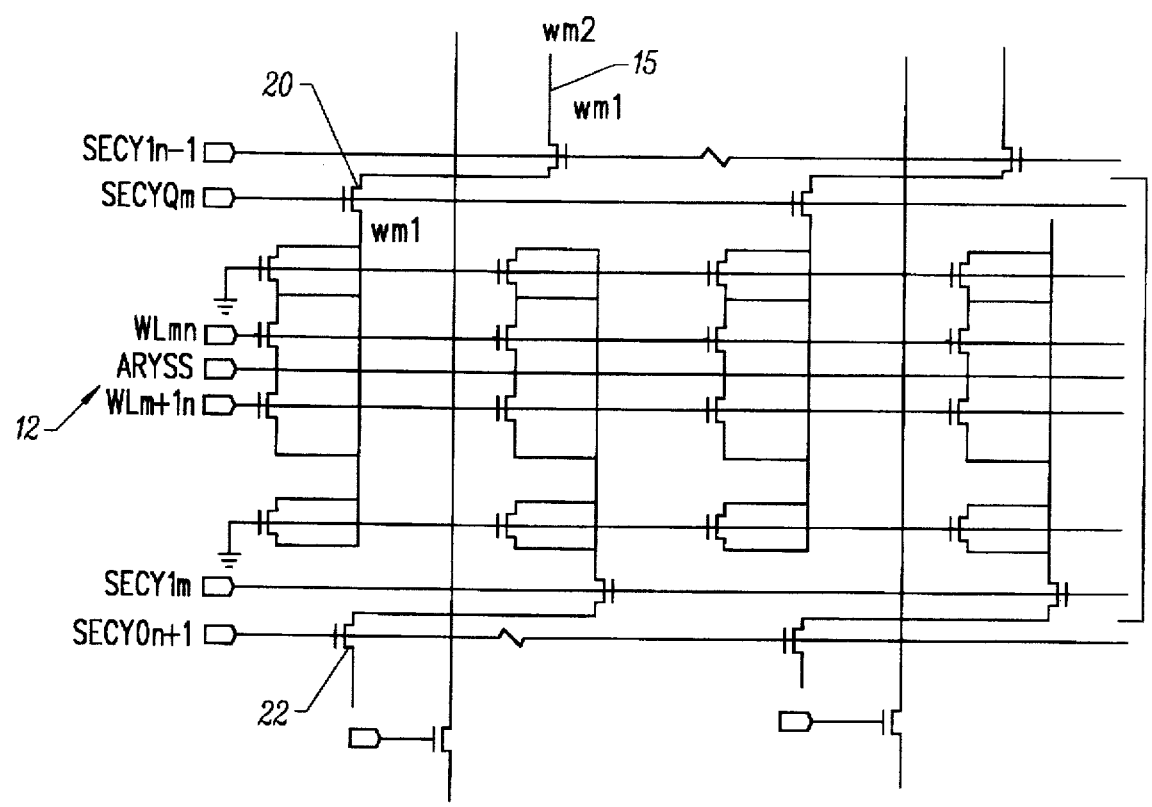
FIG. 2 represents a schematic diagram of a flash memory device having a layout according to the present invention.

FIG. 2 shows a partial schematic top view of the flash EEPROM device layout according to the present invention. FIG. 2 presents a single sector fabricated along sector select line M2 15. This sector contains two rows of transistors along wordlines WLmm and WLm+1n, respectively. Select line 20 is used to select a first set of core array transistors and is shown at the top of FIG. 2. Select line 22, is used to select a subsequent series of core array transistors and is presented at the bottom of FIG. 2.

In one embodiment of the present invention the flash EEPROM memory device includes 20 0.8 µ n-channel select transistors. Each transistor selects a particular sector within the core memory array 12. There are 512 wordlines in each sector. Each sector has 8 input/output (I/O) blocks, with each I/O block having 128 columns of memory cells. Also present in the flash EEPROM memory device of the present invention are two redundant elements, each having four columns of cells. Thus, in each sector of the flash EEPROM memory device, there are a total of 1,032 columns. For ease of description, and for obtaining a thorough understanding of the present invention, only two sectors of the flash EEPROM device of the present invention will be discussed.

Figure 3:
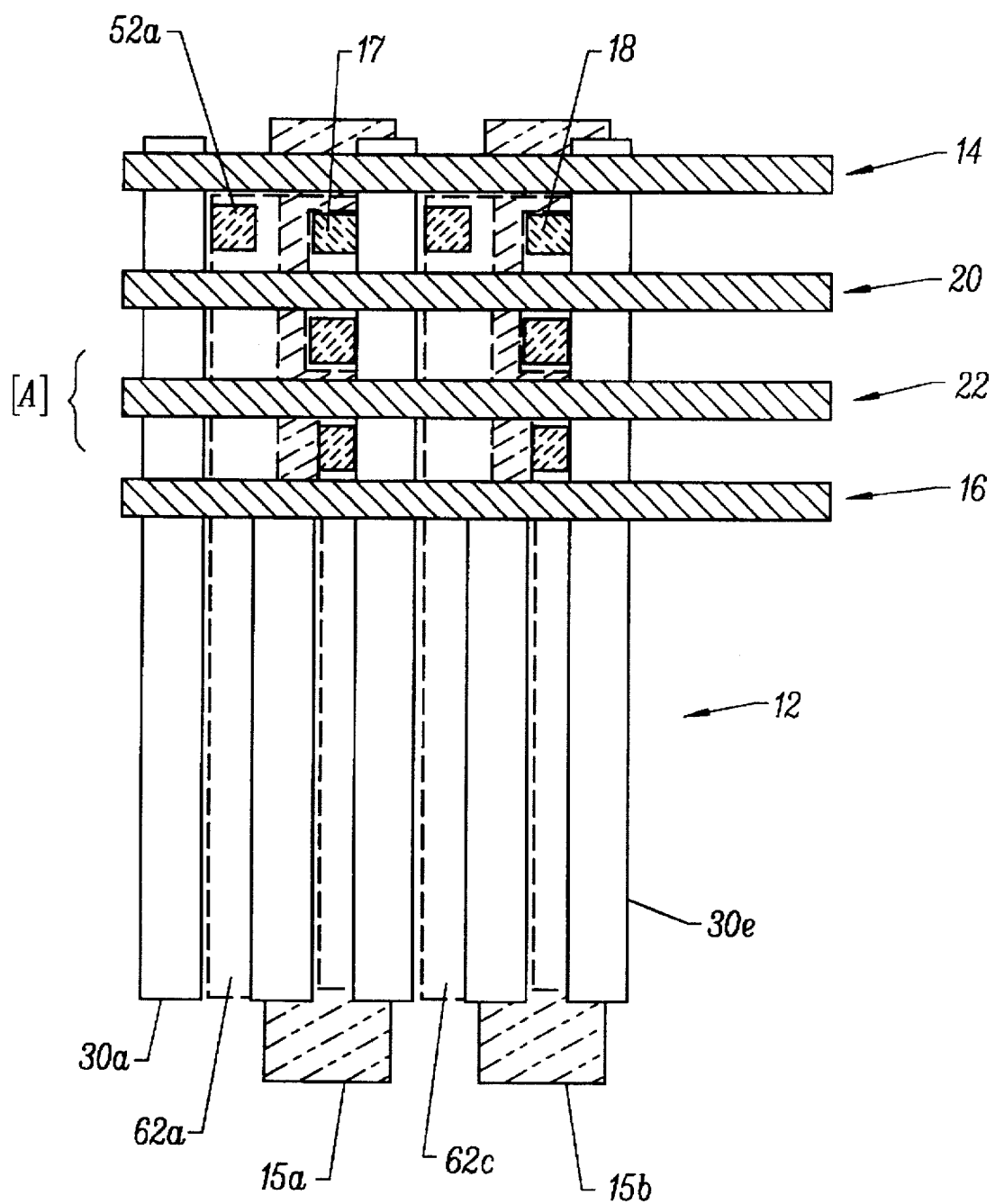
FIG. 3 provides a top view of the flash EEPROM device having a reduced physical area fabricated according to the present invention.

FIG. 3 shows the flash EEPROM memory block sector layout according to the present invention. Select transistors 20 and 22, respectively, are contained within the core array 10 of a flash EEPROM memory device. The block select transistors 20 and 22 are separated from the core array transistors 12 by ground plates 14 and 16, respectively. The block select transistors 20 and 22 are used to select among a plurality of core array transistors 12. The sector of memory shown in FIG. 3 can be coupled to external elements through jumpers 17 and 18, respectively, which are fabricated along metal II lines 15a and 15b, respectively.

A view of FIG. 1 in relation to FIG. 3, shows the reduced area provided by the layout of the present invention. As shown, the peripheral array 4 and the interface circuitry 3 (FIG. 1), which take a large amount of die area in a standard EEPROM architecture, can be placed within the much smaller area denoted A, of the core array according to the layout and fabrication steps of the present invention. Thus, as shown, a tremendous amount of physical area is saved by the fabrication and layout method of the present invention.

The fabrication process for providing the flash EEPROM device structure as depicted in FIGS. 2 and 3 will be presented with respect to FIGS. 4–9.

The fabrication process of the present invention starts with a semiconductor substrate 50 (FIG. 4) having formed thereon oxide isolation regions 30A–30E for providing device isolation between the core array transistors to be subsequently formed. The oxide isolation regions 30A–30E are formed using standard local oxidation of silicon (LOCOS) techniques.

Figure 4:
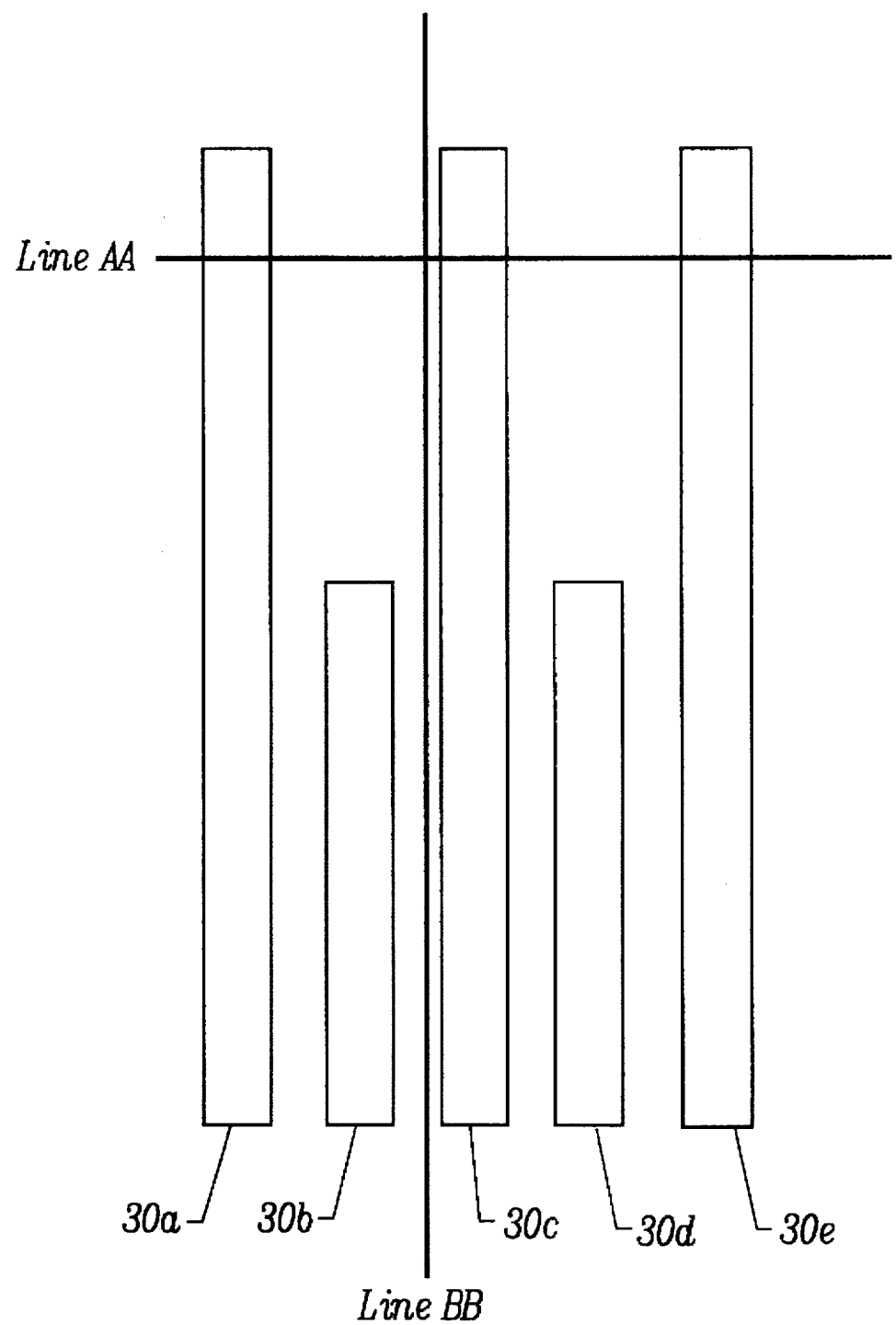
FIGS. 4–4A shows the top view and view along line AA of the flash EEPROM cell layout according to the present invention.
Figure 4A:
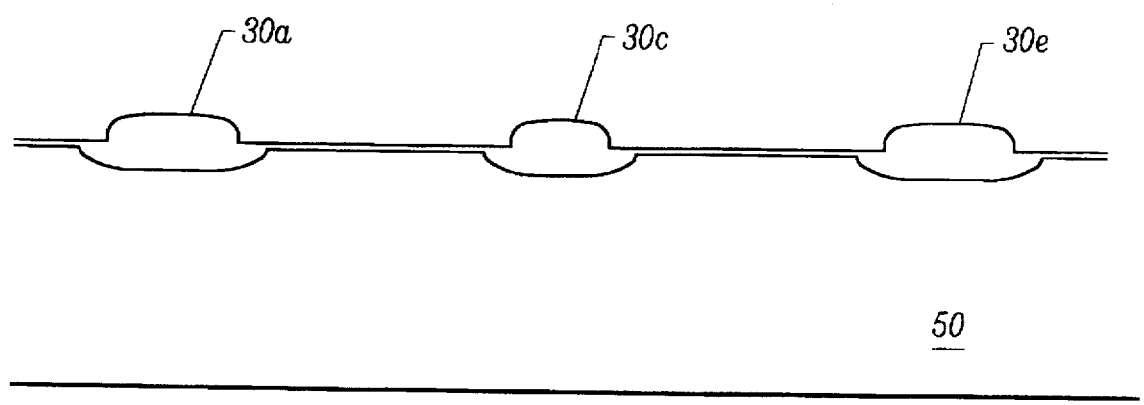

FIG. 4A shows a cross-sectional view of the initial processing steps of the present invention where isolation regions 30A, 30C and 30E are formed on the semiconductor substrate 50. In the next fabrication step (FIG. 5), the groundplates 14 and 16, respectively, and the select transistors 20 and 22 are provided on the semiconductor substrate 50. As discussed above, the purpose of the groundplate is to isolate the high voltage elements, such that the cross-talk between the high voltage elements and the core array cells will be minimized.

The groundplate 14 (FIG. 5A) is fabricated by growing a thin tunnel oxide layer 46 having a thickness of approximately 100 Å over the semiconductor substrate 50. Next, a polysilicon layer 41 is grown on top of the thin oxide layer 46. A ground voltage is applied to the polysilicon layer 41 thereby insuring that the voltage on either side of the oxide layer will not communicate with one another.

Figure 5:
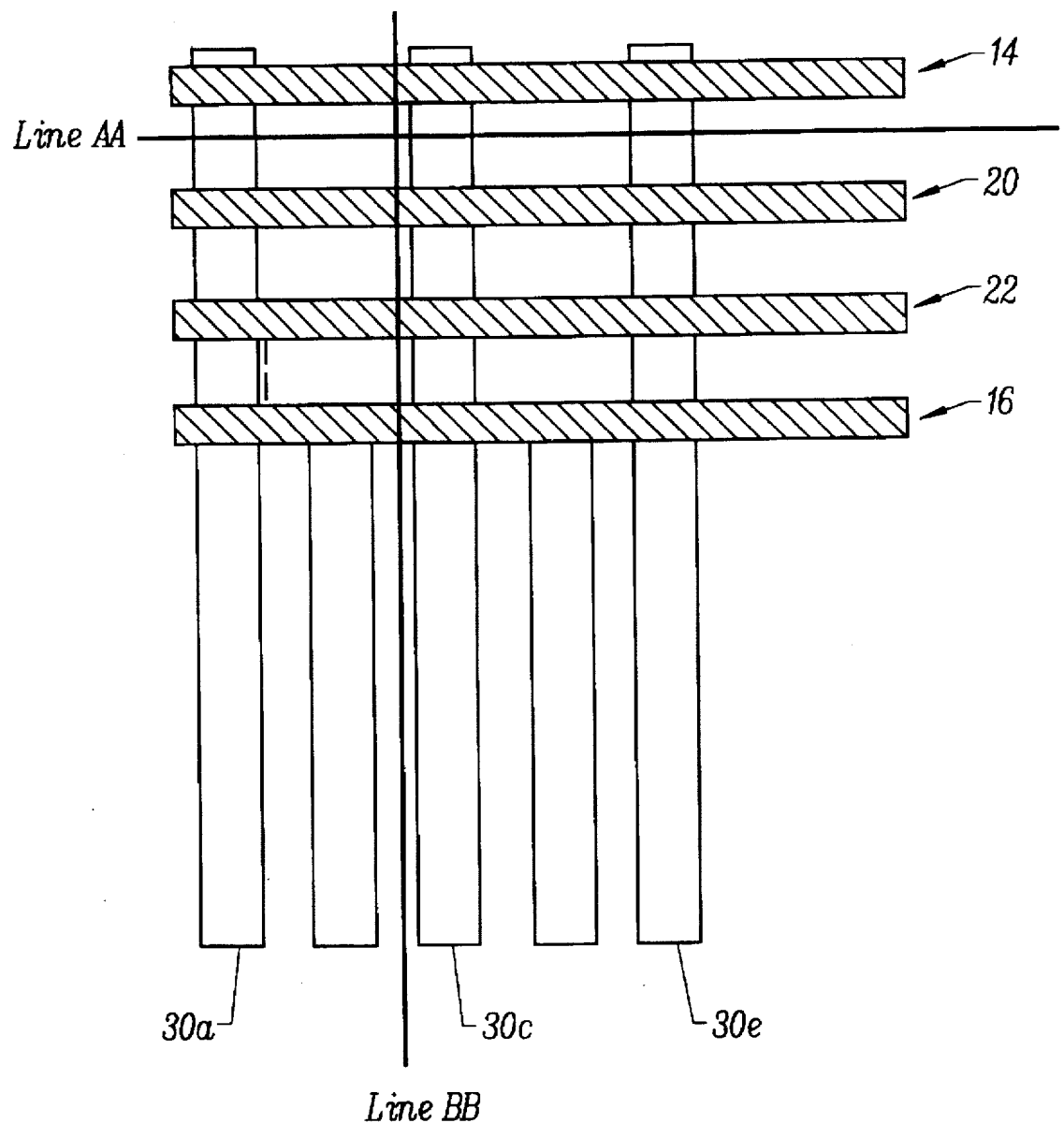
FIGS. 5–5A depict a top view and a view along line BB of a ground plate structure fabricated according to the present invention.
Figure 5A:
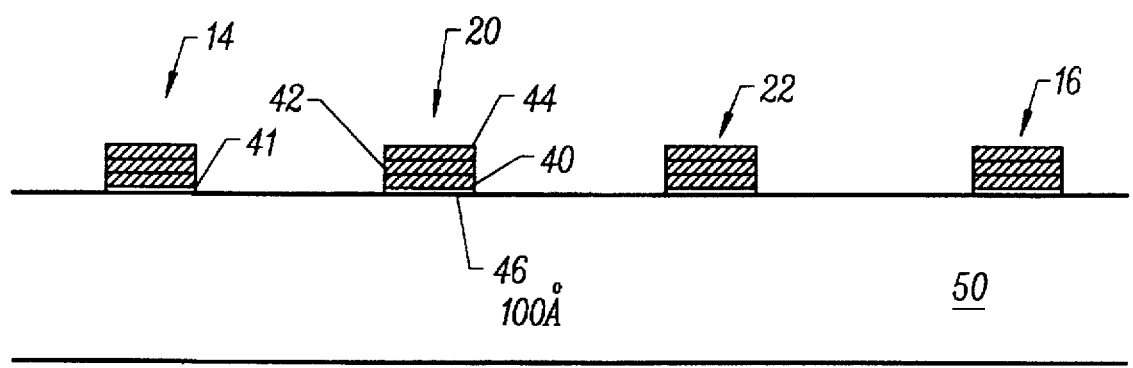

The select transistors 20 and 22 are fabricated by providing a polyI layer 40 on top of the tunnel oxide. Next, a polyII layer 42 is deposited on top of the entire length of the polyI layer 40. A tungsten silicide layer 44 is applied on top of the polyI and polyII layers 40 and 42, respectively forming a base structure. The base structure is then masked (not shown) and is subsequently etched by a reaction ion etch (RIE) method to provide the structure as shown in FIG. 5A. PolyI and polyII layers 41 and 42, respectively, are contiguous and function like a single polyI layer. The polyI layer 40 and the polyII layer 42 experience a good electrical connection because the polyI and polyII layers 40 and 42, respectively, are connected along their entire length.

Figure 6:
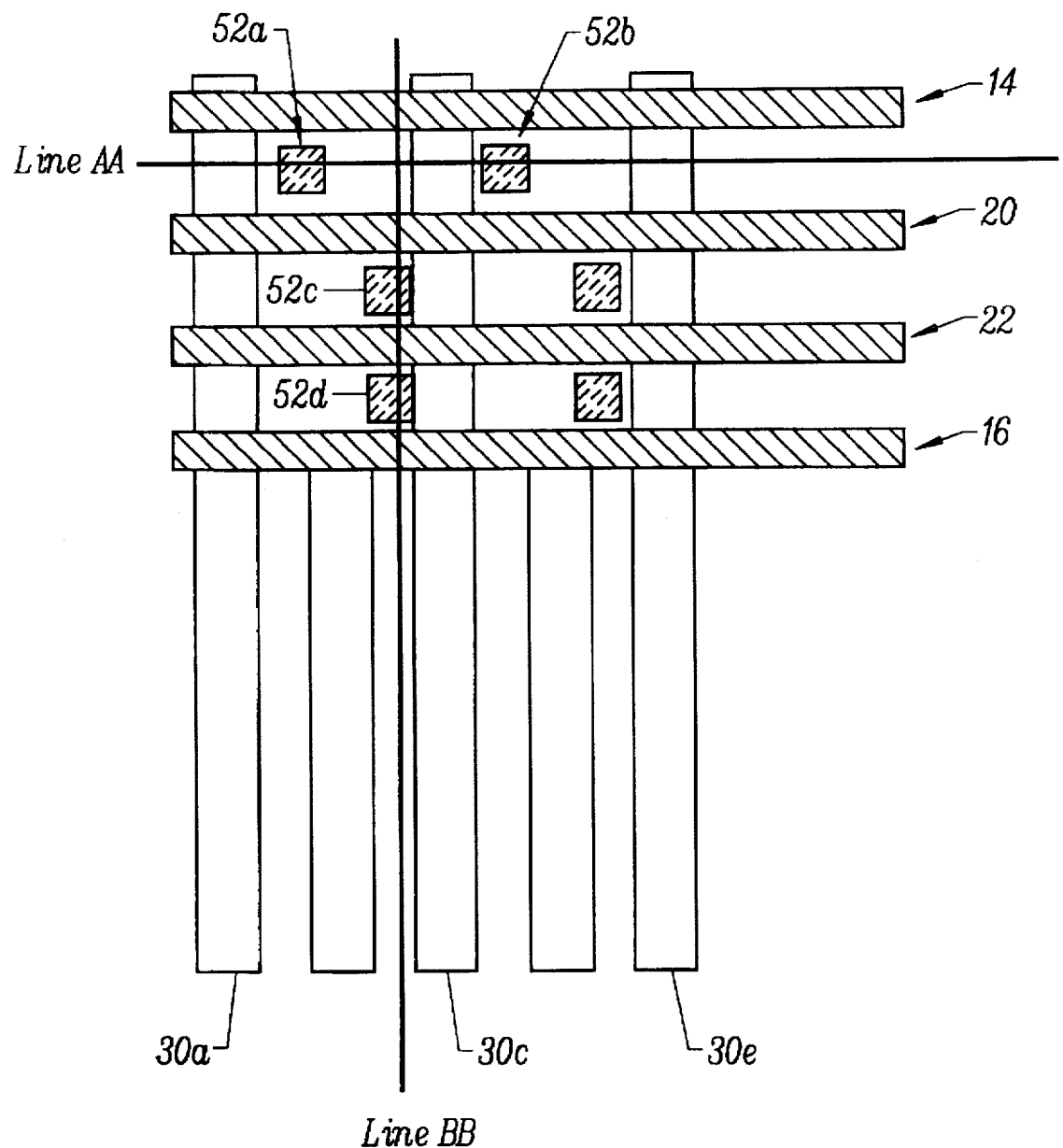
FIG. 6 shows a top view of the block select transistor fabrication according to the present invention.
Figure 6A:
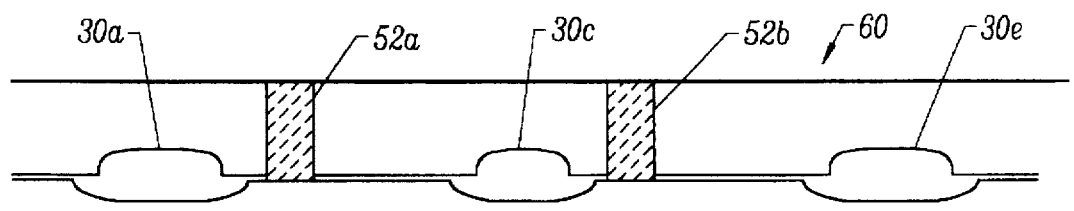
FIGS. 6A–6B shows a view along lines AA and BB, respectively, of the block select transistor section fabricated according to the present invention.

FIGS. 6 and 6A show the next processing step where an interlayer dielectric (ILD)60 is applied on top of the transistor structure shown in FIG. 5A. The interlayer dielectric 60 is generally comprised of conventional isolation reflow glass.

Figure 6B:
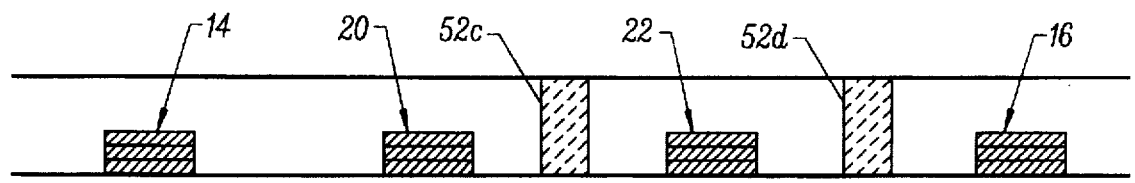

Tungsten contact plugs 52A and 52B, respectively, (FIGS. 6A–6B) are applied to the block select transistor structure by first boring a hole in the interlayer dielectric 60 using standard processing techniques then refilling these holes with tungsten material.

Figure 7:
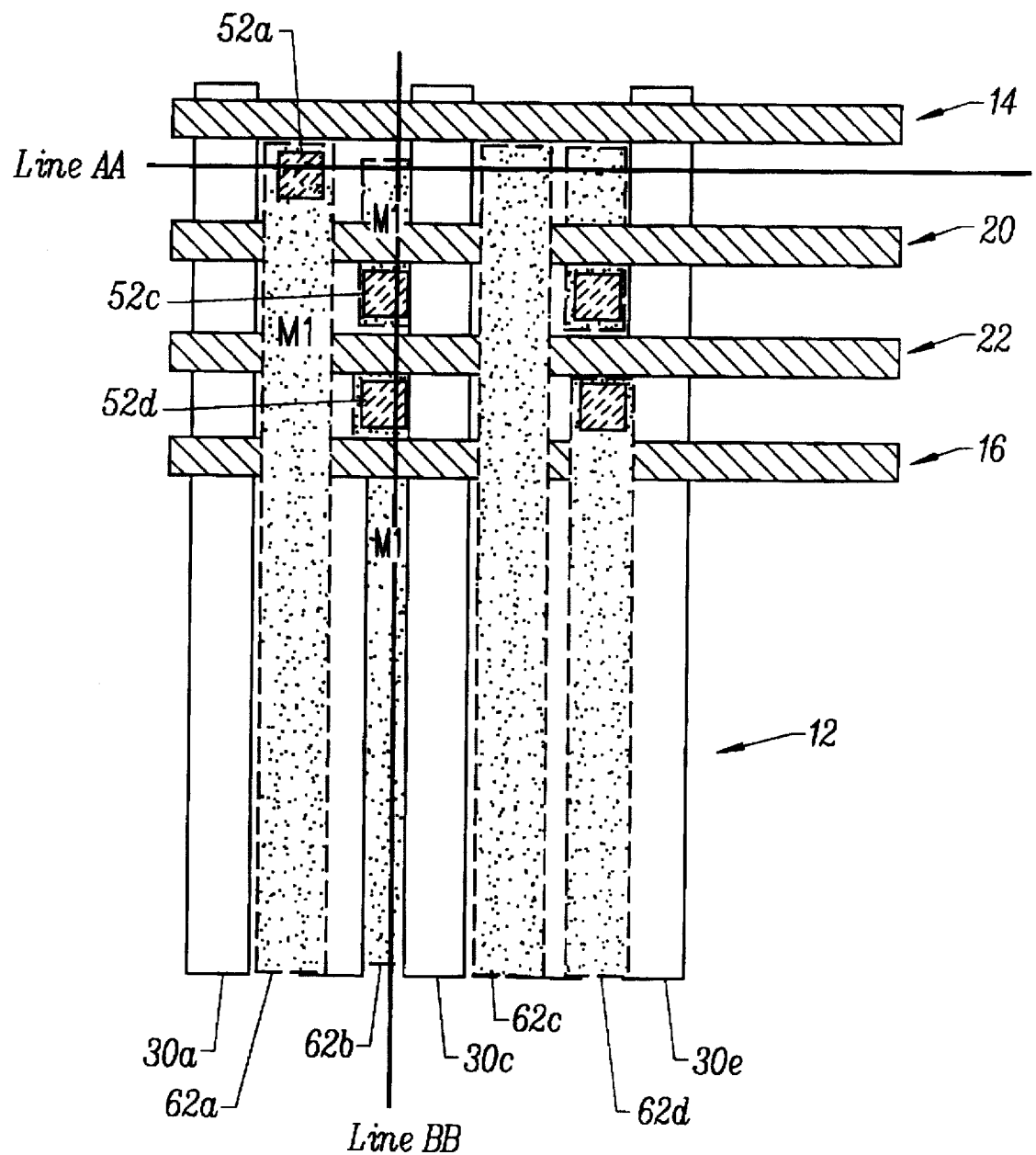
FIG. 7 is a top view of the fabrication of the block select sector and bitlines of the core memory array according to the present invention.

The tungsten contact plugs 52A and 52B are used to provide a contact between the select transistors 20 and 22 to the metal bitlines 62A–62D that are fabricated in the next processing step as shown in FIG. 7.

Figure 7A:
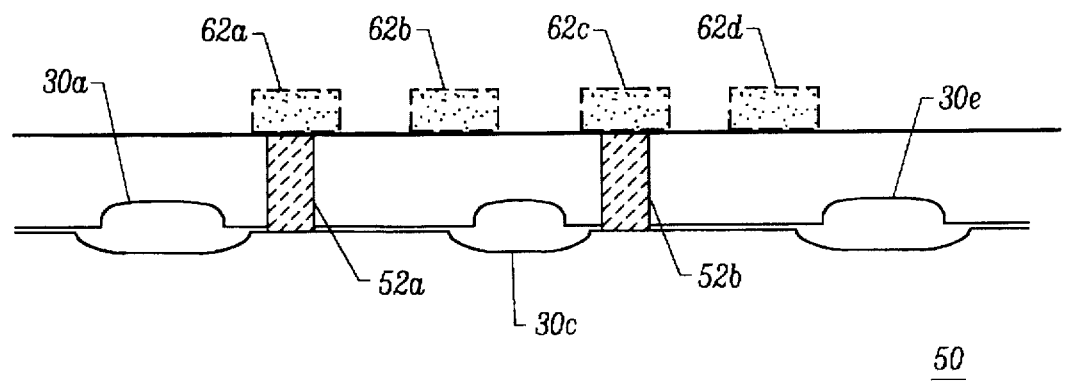
FIGS. 7A–7B provide views of the block select section and bitline layout according to the present invention along lines AA and BB, respectively.
Figure 7B:
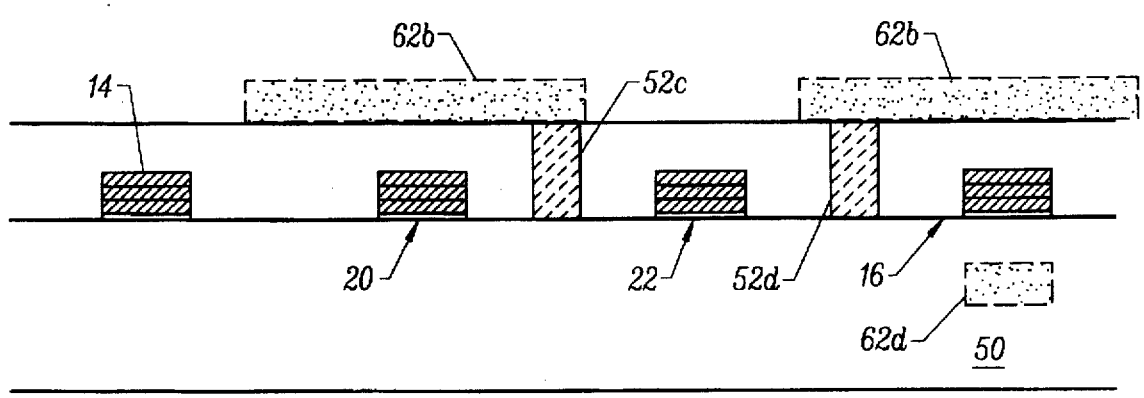

In FIG. 7, the bitlines rows M1, 62A–62D are provided as shown in FIG. 7. FIGS. 7A and 7B show that the deposited metal1 lines 62A–62D provide four bitlines for communication with the columns of core transistors 12 contained in the two sectors described herein. FIG. 7B shows how the metal1 bitline 62B is connected to select transistors 20 and 22, respectively.

Figure 8:
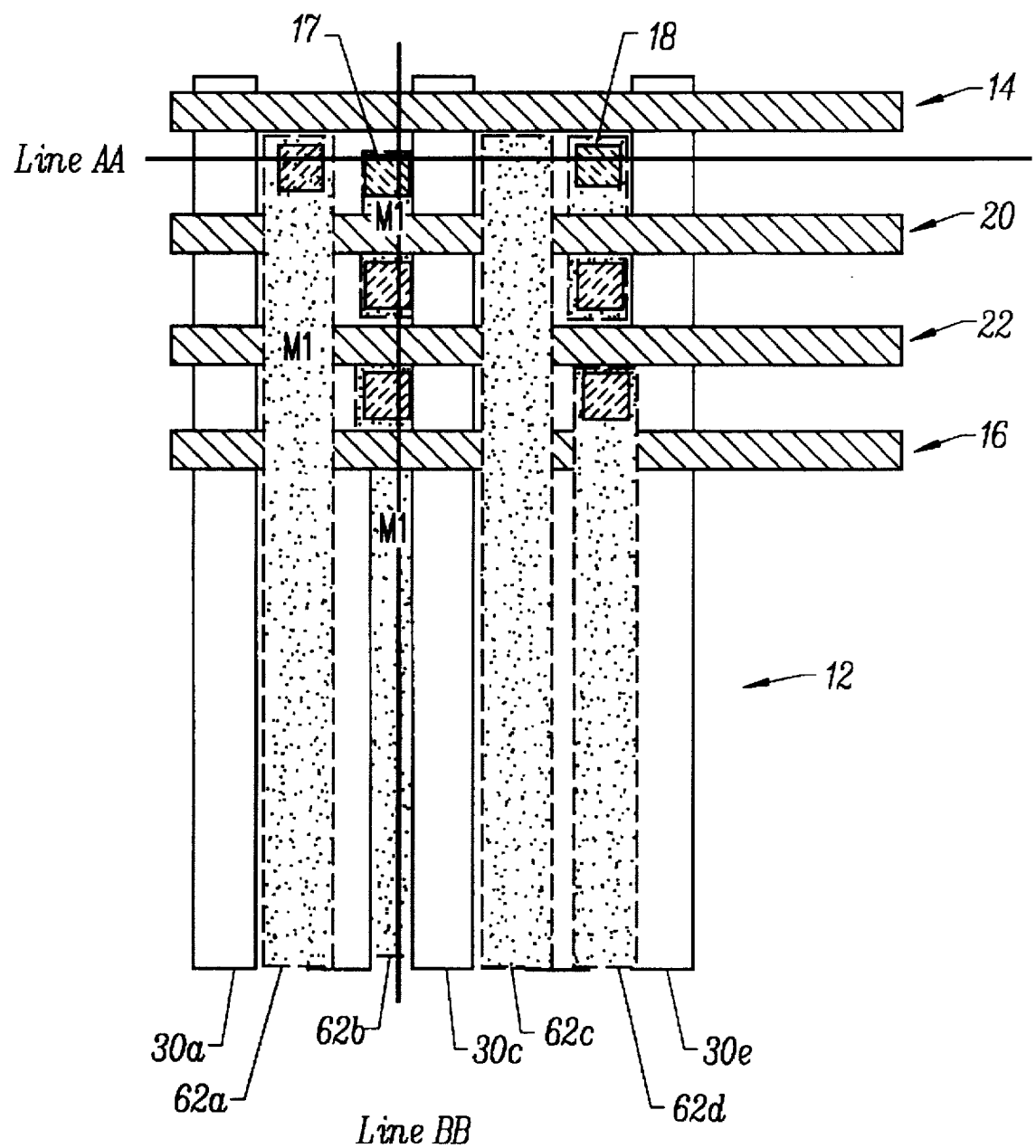
FIG. 8 provides a top view of the further fabrication of the block select section of the core array according to the present invention.
Figure 8A:
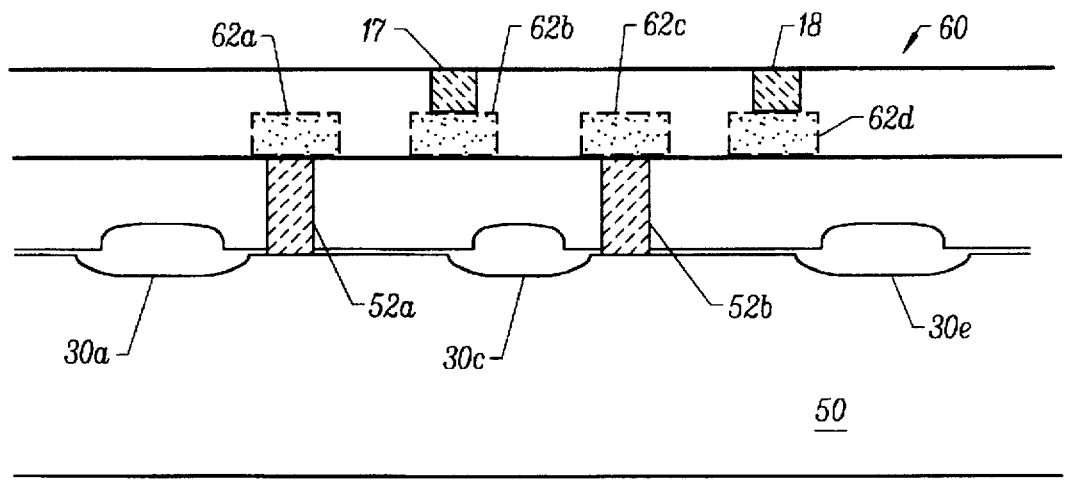
FIGS. 8A–8B provide a view of the block select section of the core array according to the present invention along lines AA and BB, respectively.
Figure 8B:
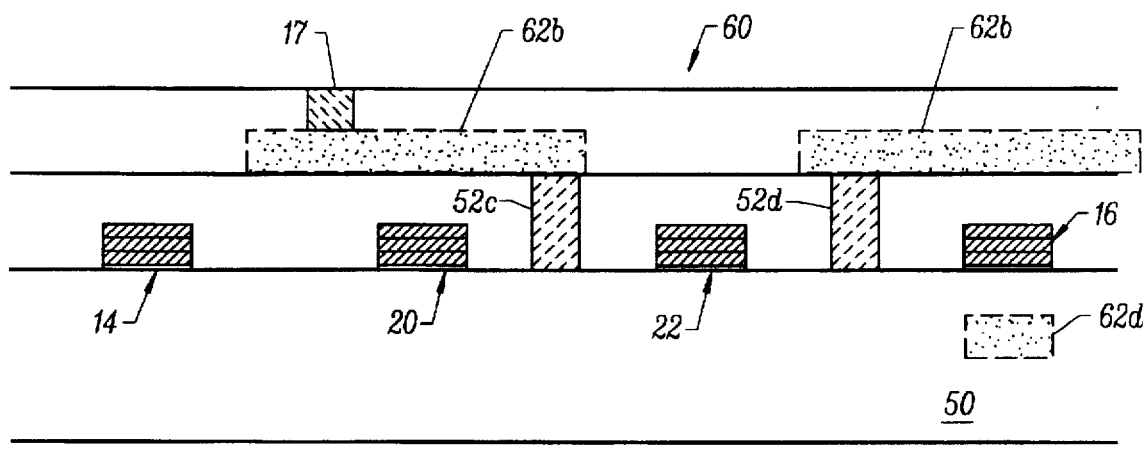

In the next processing step (FIGS. 8–8B) the jumper 17 for connecting the bitlines 62A–62D to the select lines (to be fabricated subsequently) is provided on top of the metal1 bitlines M1 by first providing a hole in ILD layer 60 then filling the hole with a jumper material. As discussed above, the jumper 17 is used to provide a contact between the metal1 52A bitline and the sector select lines (not shown), through the interlayer dielectric 60. In the final processing step, the metal2 lines 15A and 15B are deposited over the interlayer dielectric layer 60 and contact jumper 17 respectively.

The fabrication method described above is technology independent. For example, in the fabrication and layout method of the present invention the metal2 line 15A–15B has a width of 2L, where L is the minimum design rule of the memory cell. For a one (1) micron (1 µm) design rule, the channel width of the core transistors is one micron (1 82 m) long; or the length of the transistor polysilicon structure is one micron (1 µm) long. For one micron (1 µm) devices, the oxide isolation region required is two microns (2 µm). The two micron field isolation region will prevent cross-talk between adjacent devices will not communicate with one another.

Figure 9:
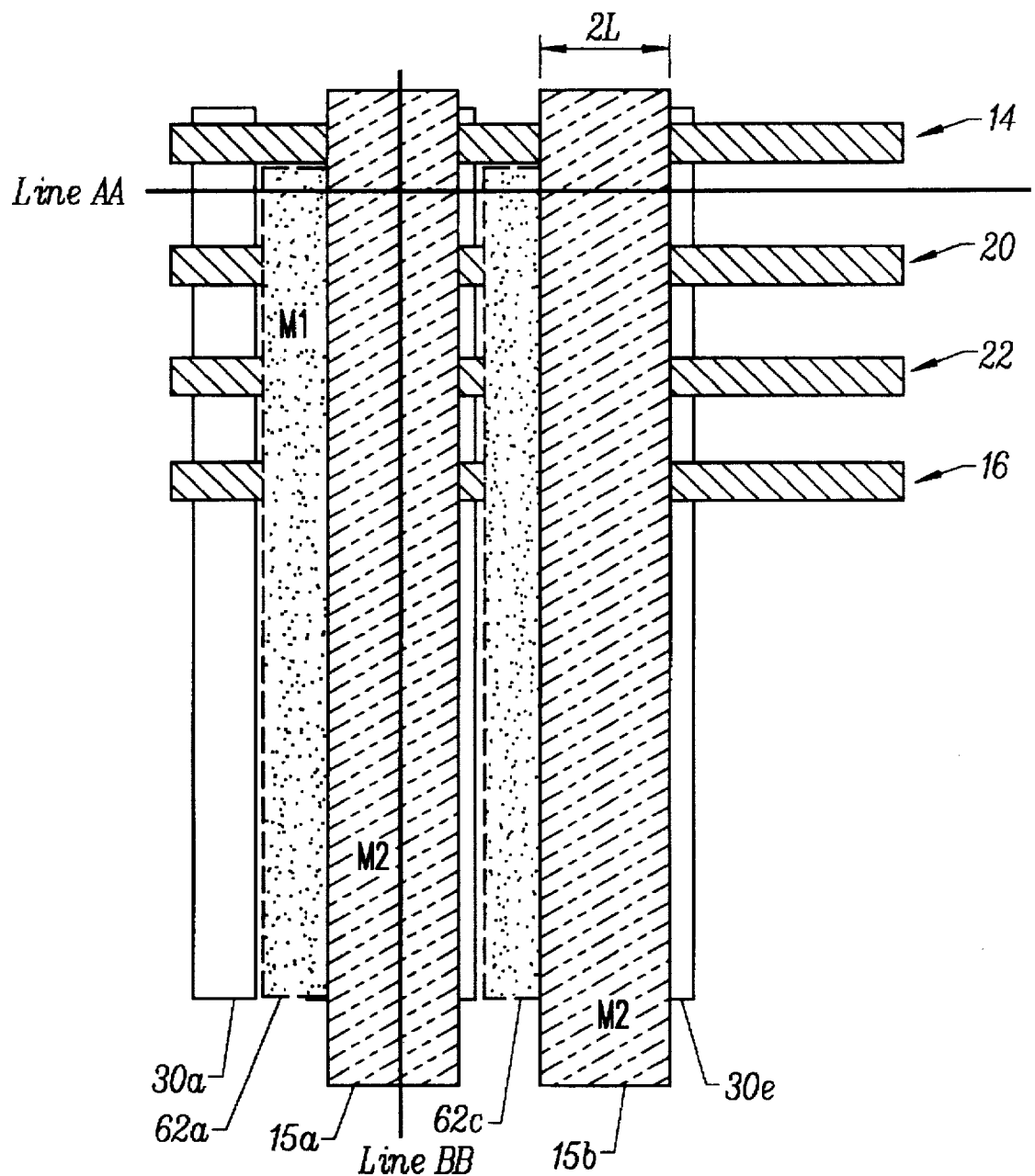
FIG. 9–9B illustrates the final structure of the block select transistor section according to the present invention.
Figure 9A:
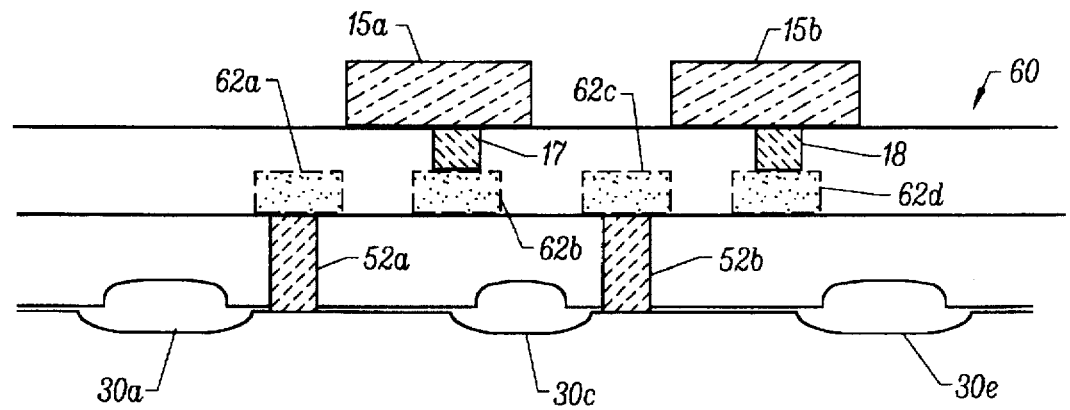
Figure 9B:
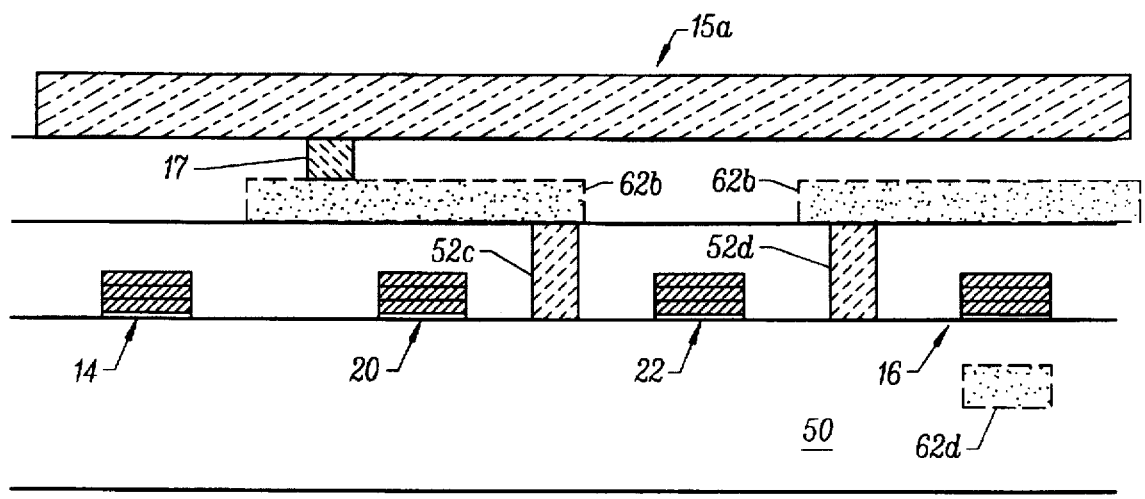

To select a particular sector of core memory transistors using the block select transistor of the present invention, a selection signal is provided along M2 15A which passes through the jumper 17 and transferred to bitline M1 62A–62D. The selection signal is then transferred to the wordlines of the core transistors of the flash memory device. Thus, as shown in FIG. 9, each M2 lines 15A and 15B communicate with two sublines M1 comprised of the bitlines M1 62A and 62B, respectively. Consequently, two sectors of the flash EEPROM device 10 of the present invention can be controlled by one M2 line 15A. The space savings provided by the layout of the present invention are dependent upon the number of sections used by a particular architecture. Depending upon the number of sections used by a particular architecture, the space savings will vary. For example, if each sector of a particular device architecture contains 16 bits, then the die savings would be 50%. Accordingly, the larger the sector required by a given component architecture, the larger the die space savings will be.

The foregoing description of the embodiments was presented for the purposes of illustration and description. The block select transistor and method of fabrication was provided as an illustration of one embodiment of a selected invention. The many features and advantages of the present invention will be readily apparent to one of average skill in the art. Obvious modifications of the process will also be readily apparent to one of average skill. All such features, advantages, and modifications are considered as being within the scope of the invention are specified herein and are defined in the following claims.

What is claimed is:

1. A method of making a flash EEPROM memory device on a semiconductor substrate, the device having an array of floating gate memory transistors formed on the semiconductor substrate and a plurality of peripheral devices, comprising the steps of:

(A) depositing oxide regions on the substrate;

(B) forming a core array of charge holding devices on the substrate, the core array comprising a plurality of transistors;

(C) forming a ground plate on the substrate, the ground plate operative to electrically isolate components formed on the substrate;

(D) forming transistor select lines on the substrate, the transistor select lines operative to select among the plurality of transistors located in the core array, the transistor select lines being separated from the core array by the ground plate;

(E) forming interconnections on the substrate, the interconnections providing a connection between the transistor select lines and the core array;

(F) depositing a first metal on the structure, the first metal acting as bit lines for the plurality of transistors present in the core array; and (G) forming a second plurality of metal lines on the substrate, each of the second plurality of metal lines operative to control two of the transistors of the core array.

2. The method of claim 1, further including the steps of:

(H) forming jumpers on the substrate, the jumpers operative to provide a signal path between the first metal bit lines and the plurality of second metal lines.

3. The method of claim 1, wherein forming the ground plate step (C) further comprises the steps of: depositing an oxide layer on the substrate; providing a polysilicon layer over the oxide layer; and applying a ground signal to the polysilicon.

4. The method of claim 1, wherein the interconnections are formed of tungsten.

5. The method of claim 1, wherein the first metal comprises aluminum.

6. The method of claim 1, wherein the second metal comprises aluminum.

7. A method of fabricating a block select transistor included within the core array of a flash EEPROM memory device, the flash EEPROM device formed on a semiconductor substrate, comprising the steps of:

(A) providing an insulating layer over the semiconductor substrate;

(B) providing a first semiconductor layer over the insulating layer;

(C) providing a second semiconductor layer contiguous to the first semiconductor layer;

(D) depositing a dielectric layer over the second semiconductor layer;

(E) applying a contact element within the dielectric layer;

(F) depositing a first polysilicon layer over the dielectric layer, the first polysilicon layer being in contact with the contact element; and (G) applying a second polysilicon layer over the first polysilicon layer.

8. The method of claim 7, wherein the insulating layer provides isolation regions.

9. The method of claim 7, further including the step (H) of providing a jumper element between the first polysilicon layer and the second polysilicon layer.

10. The method of claim 7, wherein step (E) further comprises the steps of:

(E1) forming a hole in the dielectric layer; and (E2) filling the hole with a metal.

11. The method of claim 10, wherein the metal of step (E2) is Tungsten.

12. The method of claim 7, wherein the dielectric layer of step (D) is a reflow glass.

13. A method of fabricating a block select transistor region on a semiconductor substrate, comprising the steps of:

(A) forming an oxide layer on the semiconductor substrate;

(B) forming a plurality of select transistors on the semiconductor substrate;

(C) forming a ground plate on the semiconductor substrate, the ground plate enclosing the plurality of select transistors;

(D) depositing a dielectric layer over the semiconductor substrate;

(E) forming a contact region in the dielectric layer;

(F) depositing a first metal layer over the dielectric layer;

(G) depositing a jumper material over the first metal layer; and (H) depositing a second metal layer over the jumper material.

14. The method of claim 13, further including the step of (I) forming isolation regions in the oxide layer.

15. The method of claim 13, wherein step (B) further includes the steps of:

(B1) depositing a poly I layer over the oxide layer;

(B2) depositing a poly II layer over the poly I layer;

(B3) depositing a silicide layer over the poly II layer; and (B4) masking the select transistor area; and (B5) etching the masked area.

16. The method of claim 13, wherein step (C) further includes the steps of:

(C1) depositing a polysilicon layer over the oxide layer; and (C2) providing a ground voltage to the polysilicon layer.

17. The method of claim 13, wherein step (E) further comprises the steps of:

(E1) forming a hole in the dielectric layer; and (E2) filling the hole with Tungsten.

* * * * *